United States Patent [19]
Dickey

[11] Patent Number: 5,504,389
[45] Date of Patent: Apr. 2, 1996

[54] BLACK ELECTRODE TFEL DISPLAY

[75] Inventor: Eric R. Dickey, Beaverton, Oreg.

[73] Assignee: Planar Systems, Inc., Beaverton, Oreg.

[21] Appl. No.: 208,732

[22] Filed: Mar. 8, 1994

[51] Int. Cl.$^6$ ................................................ H05B 33/02
[52] U.S. Cl. .......................... 313/506; 313/509; 313/505; 428/917
[58] Field of Search ................................. 313/506, 509, 313/512, 505, 112; 315/169.3; 345/76, 36, 45; 428/917

[56] References Cited

U.S. PATENT DOCUMENTS

| | | | |
|---|---|---|---|
| 3,560,784 | 2/1971 | Steele et al. | 313/112 |
| 4,634,639 | 1/1987 | Kawai | 313/509 X |
| 4,717,859 | 1/1988 | Sohn | 313/509 X |
| 4,870,322 | 9/1989 | Matsudaira et al. | 313/506 |
| 4,874,986 | 10/1989 | Menn et al. | 313/506 X |
| 4,963,788 | 10/1990 | King et al. | 313/509 X |
| 5,003,221 | 3/1991 | Shimizu | 313/509 |
| 5,232,543 | 10/1994 | Ryu | 313/506 X |

FOREIGN PATENT DOCUMENTS

| | | | |
|---|---|---|---|
| 0372763 | 6/1990 | European Pat. Off. | 33/22 |
| 0483783 | 6/1992 | European Pat. Off. | 33/22 |
| 2017138 | 10/1979 | United Kingdom | 33/22 |
| 2106317 | 4/1983 | United Kingdom | 313/509 |
| 9414299 | 6/1994 | WIPO | 33/22 |
| 9414298 | 6/1994 | WIPO | 33/22 |
| 9414297 | 6/1994 | WIPO | 33/22 |

*Primary Examiner*—Sandra L. O'Shea
*Assistant Examiner*—Ashok Patel
*Attorney, Agent, or Firm*—Chernoff, Vilhauer, McClung & Stenzel

[57] ABSTRACT

An electroluminescent display having a plurality of layers including at least a transparent electrode layer, a rear electrode layer, and at least three layers including an electroluminescent layer sandwiched between front and rear dielectric layers. All three layers thereof are disposed between the rear electrode layer and the transparent electrode layer wherein the transparent electrode layer is formed on a transparent substrate, so as to emit light upon the application of an electric field between the transparent electrode layer and the rear electrode layer. A thin-film absorption layer that absorbs a substantial percentage of light incident thereon is disposed between the rear electrode layer and the rear dielectric layer. The thin-film light absorption layer includes a first absorption portion having a complex refractive index that substantially matches the complex refractive index of the rear dielectric layer where they are adjacent and a second absorption portion having a complex refractive index that substantially matches the complex refractive index of the rear electrode layer where they are adjacent. In one embodiment the thin-film light absorption layer is a single layer having a complex refractive index which gradually changes. In an alternate embodiment the thin-film light absorption layer is composed of a plurality of discrete layers.

13 Claims, 2 Drawing Sheets

BLACK ELECTRODE TFEL DISPLAY

BACKGROUND OF THE INVENTION

The following invention relates to a thin-film electroluminescent (TFEL) device for providing an improved optical display. More particularly, the invention relates to a thin-film absorption layer within the device for absorbing incident light.

TFEL displays are constructed of a laminar stack comprising a set of transparent front electrodes which are typically made of indium tin oxide formed on a transparent substrate (glass), and a transparent electroluminescent phosphor layer sandwiched between transparent dielectric layers situated behind the front electrodes. Disposed behind the rear dielectric layer are rear electrodes which are usually constructed of aluminum because it provides both good electrical conductivity and a self-healing failure characteristic. Aluminum rear electrodes also enhance the luminescence of the display by reflecting back towards the viewer most of the light that would otherwise be lost to the rear of the display. This reflected light nearly doubles the light of the displayed image because the phosphor layer emits light that is directed in equal amounts in both the forward and rearward directions. However, the aluminum rear electrodes also reflect forward ambient light entering from outside of the display which is superimposed with the display information thus reducing its contrast.

To increase the contrast of the display, an antireflection coating is sometimes used on the front transparent substrate of the display to reduce the amount of ambient light reflected from the front of the display. The TFEL laminar stack may further include an enclosure seal against the substrate, with the rear wall of the enclosure blackened to block light entering from extraneous light sources behind the display. The black coating absorbs ambient light passing through the display from the front that was not reflected by the rear electrodes.

The reflection off the rear electrodes, which are typically aluminum, has a diffuse reflectance due to the surface roughness of the reflective rear electrodes, which in turn adds to the diffuse scattering from other thin-film layers of the display. The diffuse reflectance is typically measured with a photometer placed in the viewing position and perpendicular to the display. With ambient light directed at the display from a 45 degree angle to the perpendicular viewing direction, a typical TFEL display has approximately 15% diffuse reflectance. A circular polarizer filter reduces the diffuse reflectance from about 15% to about 1%, but transmits only about 37 to 42 percent of the emitted light from the display and adds substantially to the cost of the display.

Another approach that has been tried for improving the display contrast is to use indium tin oxide transparent rear electrodes. This reduces the reflectance of light off the rear electrodes and permits light to pass on through to the back of the display where it may be absorbed. However, indium tin oxide is of higher resistivity than metallic electrodes, such as those made of aluminum, and therefore must be made much thicker to achieve adequate electric conductivity. Further, thick layers of indium tin oxide do not exhibit the self-healing characteristics of aluminum rear electrodes. This can lead to an unacceptable loss in device reliability due to dielectric breakdown.

In yet another approach, shown in Steel et al., U.S. Pat. No. 3,560,784, a light-absorbing layer is incorporated into the thin-film laminate structure. This reference suggests that if a conventional metallic rear electrode is used, then a light absorbing layer may be added as an insulating layer or as a conductive layer. Insertion of a dark layer immediately behind the phosphor layer, however, can interfere with the phosphor/insulator interface leading to inferior display performance. The light pulse for one polarity may be reduced which can give rise to a flicker effect as well as to a loss in overall brightness.

Shimizu, U.S. Pat. No. 5,003,221 discloses the use of a thin-film layer that is formed between a transparent substrate and a layer formed adjacent to the transparent substrate in a TFEL laminar stack. The refractive index of the thin-film layer is made to change to approximate that of layers toward the interfaces between the thin-film layer and the corresponding layers, so that a difference in the refractive index at these interfaces is minimized. Shimizu is directed to solving the problem of maximizing the transmission of light between layers by using different real indexes of refraction. To this end, Shimizu teaches the use of multiple graded layers or a single continuous gradation, of the thin-film layer between two adjacent layers of the laminar stack to maximize the transmission of light between those respective layers.

Upon the application of an electric field between the transparent electrode layer and the rear electrode layer, light-emitting pixels are formed in the phosphor layer. Due to the physical structure of the phosphor layer, the pixels emit light mostly directed within the plane of the phosphor layer. As the emitted light travels in the phosphor layer, it is scattered by defects in the phosphor layer causing a substantial portion of the emitted light to be directed in the forward and rearward directions. Light that is directed or scattered rearwardly will be reflected forward off the rear electrodes adding to the forwardly directed light. This causes a fuzzy-looking region to appear around the addressed pixel. A circular polarizer cannot selectively reduce this effect without decreasing the overall amount of emitted light.

Emitted light striking the phosphor-dielectric boundaries at small angles to the boundaries is totally internally reflected. Light striking the phosphor-dielectric boundaries at a greater angle of incidence, refracts into the respective dielectric. The difference between the indexes of refraction of the front glass and exterior air are substantial, so the required angle of incidence for light to refract into the air is greater than all other internal interfaces. In other words, light that cannot escape the front glass-air boundary may freely refract between other layers of the TFEL laminar stack. The rearwardly directed light reflected off the glass-air boundary, and other rearwardly directed light, will impact the rear electrodes causing the light to reflect forward. Such light is either diffusely scattered or strikes a defect, thereby, will travel within the display until it possibly increases its angle with respect to the glass-air boundary permitting its escape from the display generally at a location distant from the pixel.

The apparent color of a TFEL display appears to depend upon the wavelengths of light emitted by the phosphor layer and the thicknesses of the individual thin-film layers. Amber displays typically vary in color from yellow at a perpendicular viewing angle to red/orange when viewing off the perpendicular viewing angle. Alternatively, the color of the perpendicular viewing angle may be red/orange and when viewing off the perpendicular viewing angle the color may be yellow. With current processing techniques for depositing the thin-film layers, it is hard to control the process sufficiently to produce consistent colors from screen to screen.

What is desired, therefore, is a way to enhance the contrast of the display, reduce the fuzzy looking region around the addressed pixel, reduce color variations between displays, and nearly eliminate the diffuse reflectance.

SUMMARY OF THE INVENTION

The present invention overcomes the foregoing drawbacks of the prior art by providing an electroluminescent display comprising a plurality of layers including at least a transparent electrode layer, a rear electrode layer, and at least three layers including an electroluminescent layer sandwiched between front and rear dielectric layers. All three layers are disposed between the rear electrode layer and the transparent electrode layer, so as to emit light upon the application of an electric field between the transparent electrode layer and the rear electrode layer. A thin-film absorption layer that absorbs a substantial percentage of light incident thereon is disposed between the rear electrode layer and the rear dielectric layer.

In a preferred embodiment of the invention the thin-film absorption layer has a first complex refractive index at a first side thereof that substantially match the rear dielectric thin-film layer's complex refractive index. The thin-film absorption layer also has a second complex refractive index at a second side thereof that substantially match the rear electrode layer's complex refractive index.

By locating the thin-film absorption layer in front of the rear electrode layer, ambient light and rearwardly-directed light originating from the electroluminescent element, is mostly absorbed prior to incidence with the rear electrode thereby increasing the contrast of the display. Further, by substantially matching the complex refractive indexes at both interfaces of the thin-film absorption layer with the rear electrode layer and the next adjacent layer, usually a dielectric layer, the reflections at the respective interfaces are minimized.

The absorption layer reduces the diffuse reflectance from about 15% to about 0.6% by absorbing the ambient light that would have been incident on the rear electrodes and thereby reflected forward. Further, the absorption layer reduces the color variation between displays by 80%.

Additionally, the absorption layer reduces the fuzzy looking region around the addressed pixel by absorbing rearwardly-directed light emitted from the phosphor layer and emitted light that is internally reflected rearwardly from thin-film layers.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
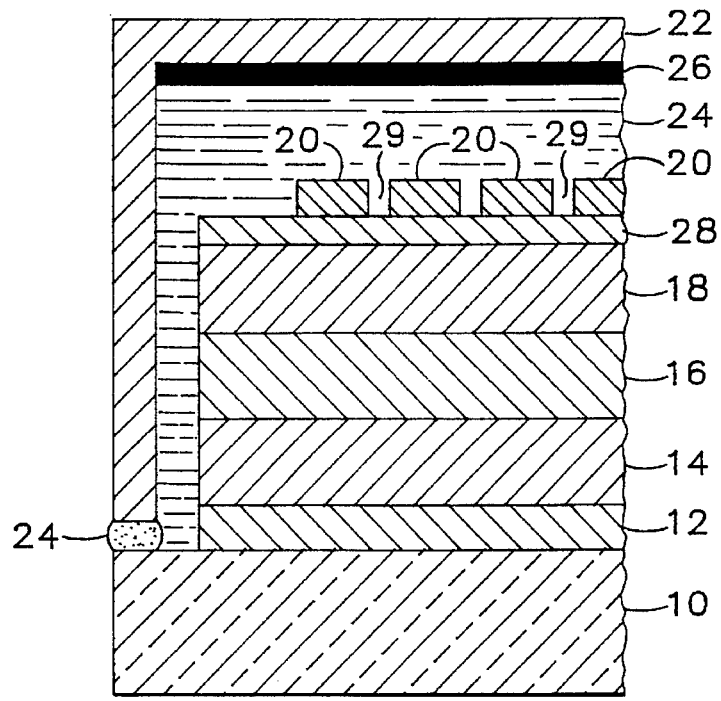
FIG. 1 is a partial cutaway view of a TFEL device constructed according to the present invention and including a single-graded continuous thin-film absorption layer.

Referring to FIG. 1, a TFEL device includes a transparent substrate 10 typically made of glass, supporting a laminar stack comprising the TFEL display elements. The laminar stack includes a set of transparent front electrodes 12 and a sandwich structure including an electroluminescent layer 16 sandwiched between front and rear dielectric layers 14 and 18, respectively. Rear electrodes 20, typically made of aluminum, are disposed behind the rear dielectric 18 and extend in a direction perpendicular to the transparent front electrodes 12 so that pixel points of light are created when electrodes in both sets are energized simultaneously. The TFEL components are sealed against the substrate 10 by an enclosure 22 which may be affixed to the substrate 10 by any suitable adhesive 24. An optically absorbent material may be injected into the cavity defined by the enclosure 22 to further absorb light. This may take the form of a silicone oil 24 which is conveniently used as a filler material or a solid filler of the type disclosed in U.S. Pat. No. 5,194,027. The silicone oil 24 may include a black-die to make it optically absorbent. The optical absorption is also enhanced by providing a black coating 26 on the rear inside cavity wall of the enclosure 22.

By providing a thin-film absorption layer 28 between the rear electrodes 20 and the rear dielectric 18 a substantial percentage of light incident thereon can be absorbed. The absorption layer 28 should substantially eliminate any reflection of light at the interface between the absorption layer 28 and the rear dielectric 18.

Each material has a complex refractive index, commonly referred to as n-ik, where n is the index of refraction relating to the speed of light in the medium and k is the extinction coefficient relating to the absorption of light in the medium. By substantially matching the index of refraction and the extinction coefficient of both the absorption layer 28 and rear dielectric 18 at the interface between them, a significant amount of light will not be reflected forward at the interface. The complex refractive indexes at the interface between the absorption layer 28 and rear electrodes 20 should also be substantially matched to minimize reflection. In other words, the complex refractive indexes of the absorption layer 28 should match the complex refractive indexes of the respective materials at both interfaces.

Figure 2:
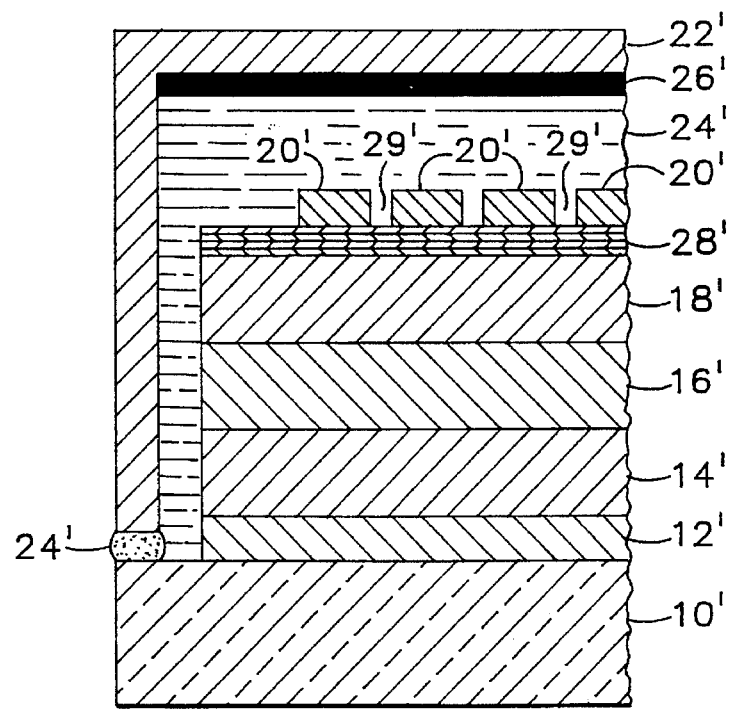
FIG. 2 is a partial cutaway view of a TFEL device constructed according to the present invention and including a multiple graded thin-film absorption layer.

To match the complex refractive indexes at both the surfaces of the absorption layer 28, the index of refraction and the extinction coefficient should be varied in some manner from one interface to the other interface so as to minimize the reflection of light within the absorption layer 28. To minimize reflection, the absorption layer 28 can be designed as a transparent material at the rear dielectric interface which gradually changes to an opaque material that absorbs a substantial amount of light at the rear electrode interface. Preferably, the absorption layer is only disposed between the individual rear electrodes 20 and the rear dielectric layer 18. The construction of the absorption layer 28 can be made either as a continuous graded thin film or as a multiple graded thin film such as absorption layers 28', as shown in FIG. 2 (The primed reference numbers of FIG. 2 refer to the same respective structure as shown in FIG. 1 except for the construction of the absorption layer 28 and 28'.) It should be noted that the absorption layer 28 may be a metal, and if this is the case, it must be patterned as shown in FIG. 2 so as not to form short circuits between the rear electrodes. Thus, the layers 28' are patterned strips with gaps therebetween that extend coextensively with the electrodes.

It has been found that an absorption layer that follows three simple design constraints provides the desired absorption properties, while minimizing unwanted reflection. The three constraints are as follows and are subsequently discussed in order:

(1) any discrete step gradations in the indexes of refraction must be extremely thin relative to the wavelength of light used in the display;

(2) the optical constants change monotonically from one material to the other; and (3) the average optical thickness of the absorption layer overall is at least large enough to be on the order of the wavelength of the display light.

First, the requirement that any steps or gradations be extremely thin relative to the wavelength of light refers to changes in the index of refraction and the extinction coefficient within the absorption layer, respectively, n and k. These are made small to avoid any significant interference. For an absorption layer 28' constructed of multiple graded layers, the changes between the index of refraction and the extinction coefficient (n-ik) of each adjacent layer are kept sufficiently small. To maintain sufficiently small changes in the complex refractive index, many thin-film layers must be employed. For a continuous absorption layer 28, the index of refraction and the extinction coefficient should change with a gradual gradient from the rear dielectric layer interface to the rear electrodes interface. By changing the complex refractive index gradually the refraction of light is reduced.

Second, the optical constants should monotonically change from one material to the other. The index of refraction and the extinction coefficient, n and k, should change in value, either respectively increasing or decreasing, without swinging back and forth within the absorption layer. If the value of either the index of refraction or the extinction coefficient, n or k, were to increase then decrease, or, alternatively, decrease then increase, within the absorption layer then reflections may result.

Third, the average optical thickness of the absorption layer must be at least large enough to be on the order of the wavelength of light. The optical thickness is the product of the index of refraction and the physical thickness of the absorption layer. The optical thickness should be at least ½ of the wavelength of light used in the display.

An absorption layer, as described, has many desirable properties when located in front of the rear electrodes 20. First, it may be optically modeled as an infinitely thick layer of transparent material because there is no substantial reflection of light within the graded layer or at the interfaces with the rear dielectric layer or rear electrodes, and it internally absorbs the incident light without substantial reflection. In other words, the absorption layer absorbs incident light directed to the rear of the display without substantial reflection of the incident light forward.

The contrast of a display is a measurement of the ambient light reflecting from a display compared to the light emitted by the display without the ambient light. By absorbing the ambient light in the absorption layer, it does not reflect forward off the rear electrodes, and the contrast of the display is increased. However, there is a brightness penalty associated with using such an absorption layer. A display with an absorption layer was found to have approximately 28% of the luminescence of an unfiltered standard reflective electrode display. This reduction is due to the loss of light initially emitted by the phosphor in other directions such as to the side and to the rear that would have been reflected forward to the viewer by standard rear electrodes. Nevertheless, even with the reduction in luminescence, a display with an absorption layer has superior contrast to the standard reflective electrode display and in some applications higher contrast is needed more than high luminescence.

Diffuse reflectance is primarily caused by light striking the rear electrodes which are typically made of shiny aluminum with a rough surface. Eliminating light from reaching the rear electrodes by the absorption layer eliminates the major component causing diffuse reflectance. A minor amount of diffuse reflectance will still occur because of the interfaces between the various laminar stack elements and the imperfections in the elements themselves. It was found that a display with an absorption layer reduces the diffuse reflectance from about 15% to about 0.6%, which greatly enhances the contrast of the display.

Also, the absorption layer is highly angle-independent in its absorption of light. Therefore, light that is scattered in a rearwardly direction that strikes the absorption layer at most angles of incidence is absorbed, thereby reducing the fuzzy looking region around the addressed pixel.

Further, light that is refracting between different thin-film layers that lacks the requisite incident angle to escape the air-dielectric boundary will also be absorbed by the absorption layer. The effect of the absorption of such refracting light is random light leaving the display.

Additionally, the absorption layer reduces the color variations between "identical" displays. It is thought that part of the color variations between different displays is caused by the interference from light being reflected forward by the rear electrodes 20. Color variations may be caused by a change in the viewing angle as well as by the small differences in the thickness of the thin-film layers between different displays. By eliminating the interference of light caused by reflections off the rear electrodes, the color variations between "identical" displays may be reduced by 80%.

A typical rear dielectric layer has an index of refraction and an extinction coefficient at a wavelength of 550 nm that are, $n=1.75$ and $k\sim0$, relating to a transparent material. Aluminum rear electrodes have an index of refraction and an extinction coefficient that are, $n=0.82$ and $k=6.0$, relating to an opaque material. With these values the absorption layer is designed to change from $n=1.75$ to $n=0.82$ and from $k\sim0$ to $k=6.0$, preferably within about 300–600 angstroms. The absorption layer can also be substantially thicker if desired. Other dielectric materials such as quartz ($n=146$, $k\sim0$) and $Ta_2O_5$ ($n=2.3$, $k\sim0$) may be used. Rear electrodes can be constructed of other materials such as chrome ($n=2.48$, $k=2.3$) if desired.

Aluminum is a preferred metal for the rear electrodes because of its conductivity and self healing characteristics, and aluminum oxide is a fusing dielectric that has some self healing characteristics. In inverted structures molybdenum is the preferred metal. The ideal method for forming an anti-reflection absorption layer then, would be by grading an aluminum oxide to aluminum electrodes. The preferred method to perform a deposition of such a material is DC reactive sputtering. This allows the use of a single target such as aluminum that is deposited at high rates. The transition from oxide at the interface with the rear dielectric layer to metal at the interface with the rear electrodes is accomplished by controlling the amount of oxygen gas in the chamber. Starting at a level sufficient to assure a pure aluminum oxide film that closely matches the complex index of refraction at the dielectric, the user slowly reduces the oxidant pressure until a pure aluminum metal is deposited, thereby matching the dielectric qualities n and k at the rear electrodes. The same outcome may also be achieved by using an RF cathode to deposit aluminum oxide and mixing this material with sputter material from an aluminum target.

Alternatively, silicon nitride could be mixed in a graded fashion with molybdenum to form an absorption layer having a gradient that goes from pure $Si_3N_4$ to pure molybdenum metal. If desired, any metal could be then added to the molybdenum to provide the necessary conductivity. Although several methods could be used for depositing such a material, the preferred method is a vacuum deposition. The oxide in metal could be co-deposited from separate sources, with a relatively slow change from high oxide/low metal rates to low oxide/high metal rates, and finally to pure metal. Other deposition techniques such as depositing metals and transparent materials such as oxides, fluorides and nitrides could also successfully be used.

Although many system configurations could work, the preferred geometry is a "carousel" type configuration such as those manufactured by Kurdex Corporation or Leybold, with the substrates on the side of a polygon which forms a rough cylinder. The cylinder is then spun with the substrates passing in front of one or more cathodes. The process is then slowly changed from a metal oxide process to a metal process as the carousel turns. Because of the conductivity of the absorption layer the absorption layer is preferably located only between each rear electrode and the rear dielectric by using a standard lift-off or etching process well known to one skilled in the art. Regardless of the deposition technique, however, gaps 29' must be left between the electrodes if the change in material takes the absorption layer to pure metal at the end adjacent the electrodes.

Figure 3:
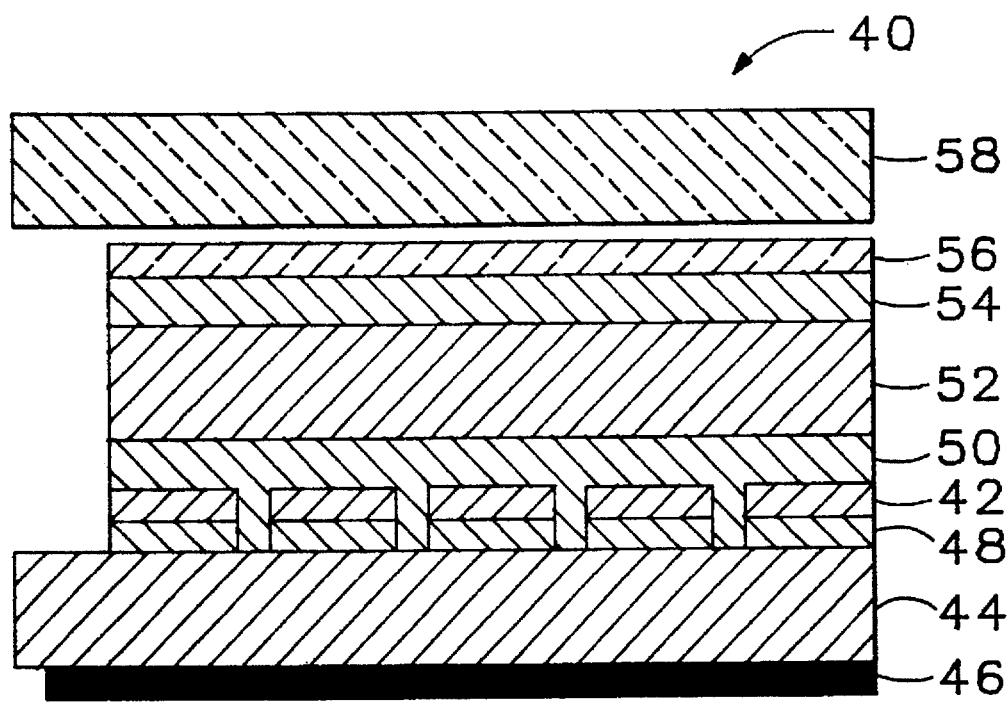
FIG. 3 is a partial cutaway view of an alternative embodiment of a TFEL device constructed according to the present invention and including a multiple graded thin-film absorption layer.

FIG. 3 shows an "inverted" structure electroluminescent device 40 that is similar to FIGS. 1 and 2. The device 40 is constructed with a substrate 44 that preferably has a black coating 46 on the lower side if the substrate 44 is transparent. On the substrate 44 are deposited rear electrodes 48. Between the rear electrodes 48 and the rear dielectric layer 50 is a thin-film absorption layer 42. The absorption layer is either constructed of multiple graded thin-film layers or as a continuous graded thin-film layer using any appropriate method previously described. An electroluminescent layer 52 is sandwiched between the rear dielectric layer 50 and a front dielectric layer 54. A transparent electrode layer 56 is formed on the front dielectric layer 54 and is enclosed by a transparent substrate 58 that is either bonded directly to the transparent electrode layer 56 or separated by a gap. The graded absorption layer 42 is designed, as previously described, such that it absorbs a substantial percentage of incident light thereon.

Several alternative design changes are within the scope of the invention. In the case of using a grading from an oxide mixture to a metal, the index of refraction and the extinction coefficient could switch back toward the oxide without detracting from the overall performance of the absorption layer if the switch occurs after enough thickness of material has been deposited so as to absorb a majority of the incident light. Further, a portion of the reflected light at the switch will further be absorbed by the absorption layer as it passes forward. It is possible to add additional thin-film layers to the laminar stack, including between the rear dielectric layer and the rear electrode layer.

A little bit of leeway exists on the metal side of the absorption layer since most of the light has been absorbed by the time it reaches that point. As a result one can reduce the reflection off the rear electrodes to less than 2 percent (from 90 percent without the absorption layer) with about 400 angstroms total thickness in the absorption layer.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An electroluminescent device comprising:
   (a) a plurality of layers including at least a transparent electrode layer, a rear electrode layer, and at least three layers including an electroluminescent layer sandwiched between front and rear dielectric layers, all three layers thereof disposed between said rear electrode layer and said transparent electrode layer so as to emit light upon the application of an electric field between said transparent electrode layer and said rear electrode layer; and
   (b) a thin-film light absorption layer that absorbs a substantial percentage of light incident thereon and which is disposed between said rear electrode layer and said rear dielectric layer, said light having a wavelength, said thin-film light absorption layer comprising:
      (i) a first absorption portion having a first complex refractive index at a side adjacent said rear dielectric layer, said rear dielectric layer having an initial complex refractive index that substantially matches said first complex refractive index at a side adjacent said first absorption portion; and
      (ii) a second absorption portion having a second complex refractive index at a side adjacent said rear electrode layer, said rear electrode layer having a complex refractive index that substantially matches said second complex refractive index at a side adjacent said second absorption portion.

2. The electroluminescent device of claim 1 wherein said first absorption portion of said light absorption layer is transparent and said second absorption portion is substantially opaque.

3. The electroluminescent device of claim 1 wherein said first complex refractive index changes from said first absorption portion of said light absorption layer with a gradual gradient to said second complex refractive index at said second absorption portion of said light absorption layer.

4. The electroluminescent device of claim 1 wherein said first complex refractive index monotonically changes to said second complex refractive index and wherein:
   (a) said thin-film light absorption layer is composed of a plurality of discrete layers that are thin relative to said light's wavelength, wherein a first layer of said discrete layers is said first absorption portion and a last layer of said discrete layers is said second absorption portion; and
   (b) said thin-film layer's average optical thickness is at least large enough to be on the order of said light's wavelength.

5. The electroluminescent device of claim 1 wherein:
   (a) a first index of refraction of said first complex refractive index decreases in value toward a second index of refraction of said second complex refractive index; and
   (b) a first extinction coefficient of said first complex refractive index increases in value toward a second extinction coefficient of said second complex refractive index.

6. The electroluminescent device of claim 5 wherein:
   (a) said first index of refraction and said first extinction coefficient are, respectively, approximately 0.0 and 1.75; and (b) said second index of refraction and said second extinction coefficient are, respectively, approximately 6.0 and 0.8.

7. In a TFEL device for providing an optical display, a substrate supporting a laminar thin film which includes a set of transparent front electrodes, a set of rear electrodes, and a phosphor layer sandwiched between front and rear dielectric layers, and disposed between said front and rear electrodes the improvement comprising:

(a) a thin-film light absorption layer that absorbs a substantial percentage of light incident thereon; and (b) said light absorption layer disposed between said rear dielectric layer and said set of rear electrodes; and (c) said thin-film light absorption layer comprising:

(i) a first absorption portion having a first complex refractive index at a side adjacent said rear dielectric layer, said rear dielectric layer having an initial complex refractive index that substantially matches said first complex refractive index at a side adjacent said first absorption portion; and (ii) a second absorption portion having a second complex refractive index at a side adjacent said rear electrode layer, said rear electrode layer having a complex refractive index that substantially matches said second complex refractive index at a side adjacent said second absorption portion.

8. The electroluminescent device of claim 7 wherein said first complex refractive index changes from said first absorption portion of said light absorption layer with a gradual gradient to said second complex refractive index at said second absorption portion of said light absorption layer.

9. The electroluminescent device of claim 7 wherein said first complex refractive index monotonically changes to said second complex refractive index and wherein:

(a) said thin-film light absorption layer is composed of a plurality of discrete layers that are thin relative to said light's wavelength, wherein a first layer of said discrete layers is said first absorption portion and a last layer of said discrete layers is said second absorption portion; and (b) said thin-film layer's average optical thickness is at least large enough to be on the order of said light's wavelength.

10. An electroluminescent device comprising:

(a) a plurality of layers including at least a transparent electrode layer, a rear electrode layer, and at least three layers including an electroluminescent layer sandwiched between front and rear dielectric layers, all three layers thereof disposed between said rear electrode layer and said transparent electrode layer so as to emit light upon the application of an electric field between said transparent electrode layer and said rear electrode layer; and (b) a thin-film light absorption layer that absorbs a substantial percentage of light incident thereon and which is disposed between said rear electrode layer and said rear dielectric layer, said thin-film light absorption layer comprising:

(i) a first absorption portion having a first complex refractive index at a side adjacent a first adjacent layer, said first adjacent layer having an initial complex refractive index that substantially matches said first complex refractive index at a side adjacent said first absorption portion; and (ii) a second absorption portion having a second complex refractive index at a side adjacent a second adjacent layer, said second adjacent layer having a complex refractive index that substantially matches said second complex refractive index at a side adjacent said second absorption portion.

11. The electrolumininescent device of claim 10 wherein said first adjacent layer is said rear dielectric layer and said second adjacent layer is said rear electrode layer.

12. The electroluminescent device of claim 10 wherein said first complex refractive index changes from said first absorption portion of said light absorption layer with a gradual gradient to said second complex refractive index at said second absorption portion of said light absorption layer.

13. The electroluminescent device of claim 10 wherein said first complex refractive index monotonically changes to said second complex refractive index and wherein:

(a) said thin-film light absorption layer is composed of a plurality of discrete layers that are thin relative to said light's wavelength, wherein a first layer of said discrete layers is said first absorption portion and a last layer of said discrete layers is said second absorption portion; and (b) said thin-film layer's average optical thickness is at least large enough to be on the order of said light's wavelength.

* * * * *

UNITED STATES PATENT AND TRADEMARK OFFICE
CERTIFICATE OF CORRECTION

PATENT NO. : 5,504,389
DATED : April 2, 1996
INVENTOR(S) : Eric R. Dickey

It is certified that error appears in the above-identified patent and that said Letters Patent is hereby corrected as shown below:

Col. 4, Line 21: Delete "black-die and insert --black die--

Col. 6, Line 38: Delete "~" and insert --∝--

Line 42: Delete "~" and insert --∝--

Line 45: Delete "~" and insert --∝--

Line 46: Delete "~" and insert --∝--

Signed and Sealed this

Twenty-second Day of April, 1997

BRUCE LEHMAN

*Commissioner of Patents and Trademarks*

*Attest:*

*Attesting Officer*